(12) United States Patent
Kindt

(10) Patent No.: US 7,170,347 B1
(45) Date of Patent: Jan. 30, 2007

(54) OFFSET TRIM CIRCUIT AND METHOD FOR A CONSTANT-TRANSCONDUCTANCE RAIL-TO-RAIL CMOS INPUT CIRCUIT

(75) Inventor: Willem Johannes Kindt, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 518 days.

(21) Appl. No.: 10/716,019

(22) Filed: Nov. 17, 2003

(51) Int. Cl.
*H03F 3/45* (2006.01)

(52) U.S. Cl. .......................... 330/253; 330/9; 330/255; 330/258

(58) Field of Classification Search ................ None
See application file for complete search history.

(56) References Cited

U.S. PATENT DOCUMENTS 4,618,833 A   10/1986  Russell
4,797,631 A * 1/1989  Hsu et al. .................. 330/253
6,194,962 B1* 2/2001  Chen ......................... 330/253
6,696,894 B1* 2/2004  Huang ....................... 330/253

* cited by examiner

Primary Examiner—Khank Van Nguyen
(74) Attorney, Agent, or Firm—Darby & Darby P.C.; Matthew M. Gaffney

(57) ABSTRACT

A constant-transconductance rail-to-rail CMOS input circuit with offset trim is provided. PMOS and NMOS differential trim stages are scaled versions of PMOS and NMOS input stages respectively. The differential trim stages are configured to adjust the offset of the differential output current with accuracy over temperature. A first current mirror circuit is configured to receive a fraction of a bias current ($\beta I$), where $\beta$ is related to the input common mode voltage. A second current mirror circuit is configured to receive another fraction of the bias current $((1-\beta)I)$. The first current mirror circuit is configured to provide current $\beta I$ to the PMOS input stage, and a scaled-down version of current $\beta I$ to the PMOS differential trim stage. The second current mirror circuit is configured to provide current $((1-\beta)I)$ to the NMOS input stage, and a scaled-down version of current $((1-\beta)I)$ to the differential PMOS trim stage.

22 Claims, 2 Drawing Sheets

US 7,170,347 B1

OFFSET TRIM CIRCUIT AND METHOD FOR A CONSTANT-TRANSCONDUCTANCE RAIL-TO-RAIL CMOS INPUT CIRCUIT

FIELD OF THE INVENTION

The present invention is related to offset trimming, and, in particular, to a system and method for a rail-to-rail CMOS input circuit with constant transconductance and offset trimming.

BACKGROUND OF THE INVENTION

Rail-to-rail input stages are important for low-supply voltage systems which are used in many system applications. A well-known problem of rail-to-rail input stages is offset glitch. Most rail-to-rail input stages include a p-type differential pair and an n-type differential pair. For this configuration, the p-type differential pair is active only for low input common mode voltages, and the n-type differential pair is only active for high input common mode voltages. However, the input offset voltage must make a transition between the offset of the p-type differential pair to the n-type differential pair when the input common mode voltage increases from low to high values. The transition often causes rail-to-rail MOS operational amplifiers to have a poor common mode rejection ratio (CMRR).

BRIEF DESCRIPTION OF THE DRAWINGS

Non-limiting and non-exhaustive embodiments of the present invention as described with reference to the following drawings.

DETAILED DESCRIPTION OF A PREFERRED EMBODIMENT

Figure 1:
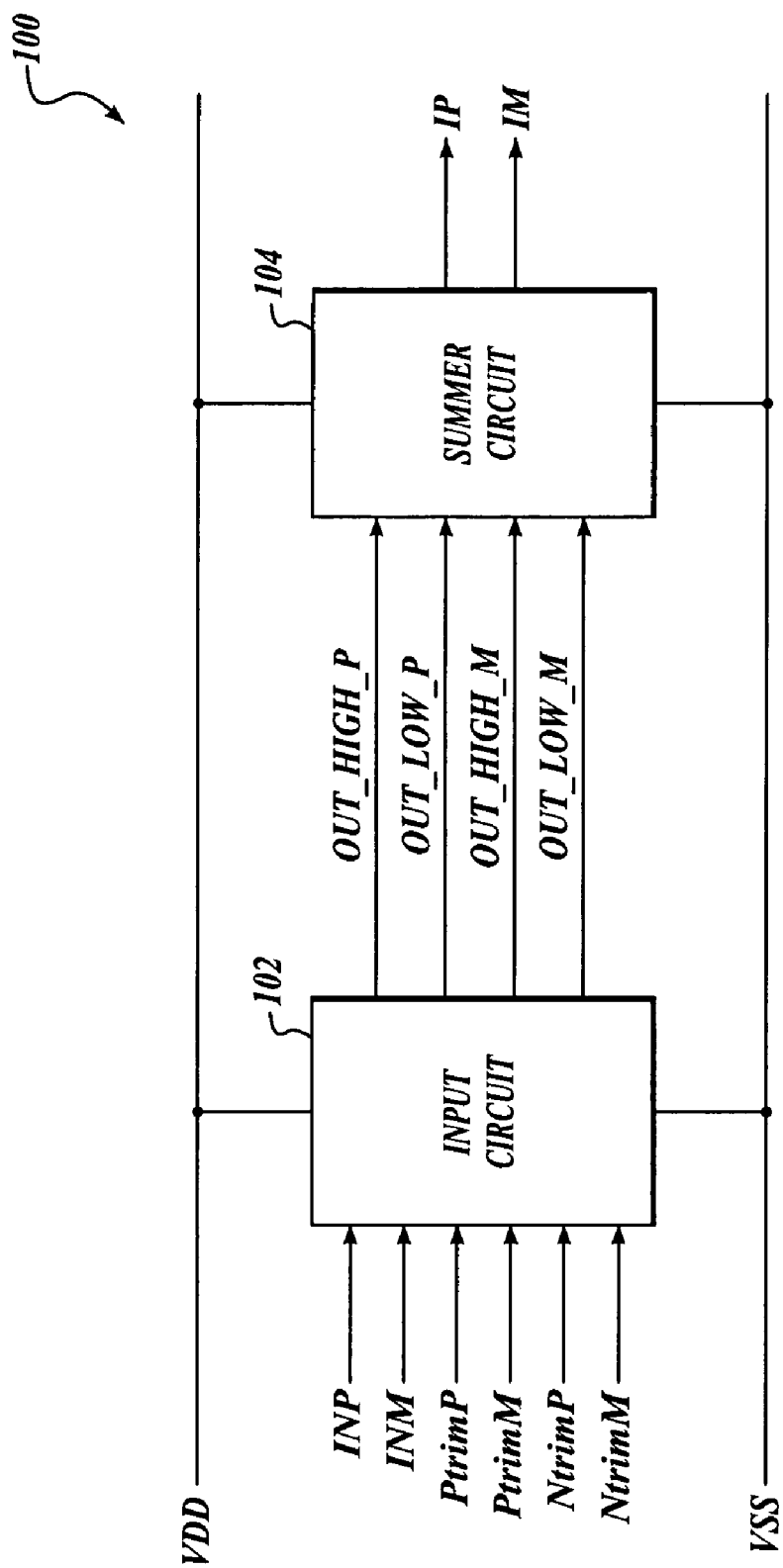
FIG. 1 illustrates a block diagram of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a constant-transconductance rail-to-rail CMOS input circuit with offset trim. PMOS and NMOS differential trim stages are scaled versions of PMOS and NMOS input stages respectively. The differential trim stages are configured to adjust the offset of the differential output current with accuracy over temperature. A first current mirror circuit is configured to receive a fraction of a bias current ($\beta I$), where $\beta$ is related to the input common mode voltage. A second current mirror circuit is configured to receive another fraction of the bias current (($1-\beta)I$). The first current mirror circuit is configured to provide current $\beta I$ to the PMOS input stage, and a scaled-down version of current $\beta I$ to the PMOS differential trim stage. The second current mirror circuit is configured to provide current (($1-\beta)I$) to the NMOS input stage, and a scaled-down version of current (($1-\beta)I$) to the differential PMOS trim stage.

FIG. 1 is illustrates a block diagram of a circuit (100) that includes input circuit 102 and summer circuit 104. Input circuit 102 is a CMOS input circuit that is configured for rail-to-rail operation. Input circuit 102 is arranged to trim the offset with accuracy over temperature, and further arranged to have a relatively constant transconductance over a range of input common mode voltage. Input circuit 102 is configured to receive a differential input signal ($V_{in}$=inP−inM), a differential PMOS trim signal ($V_{trim,p}$=PtrimP−PtrimM), and a differential NMOS trim signal ($V_{trim,n}$=NtrimP−NtrimM). Input circuit 102 is further configured to provide a PMOS differential output current (out_high_P−out_high_M) and an NMOS differential output current (out_low_P−out_low_M) in response to the differential input signal.

Summer circuit 104 is configured to provide a differential output current ($I_{out}$=IP−IM) in response to the PMOS differential output current and the NMOS differential output current. The differential output current is the sum of the PMOS differential output current and the NMOS differential output current. An exemplary summer circuit 104 could include a folded cascode circuit.

Figure 2:
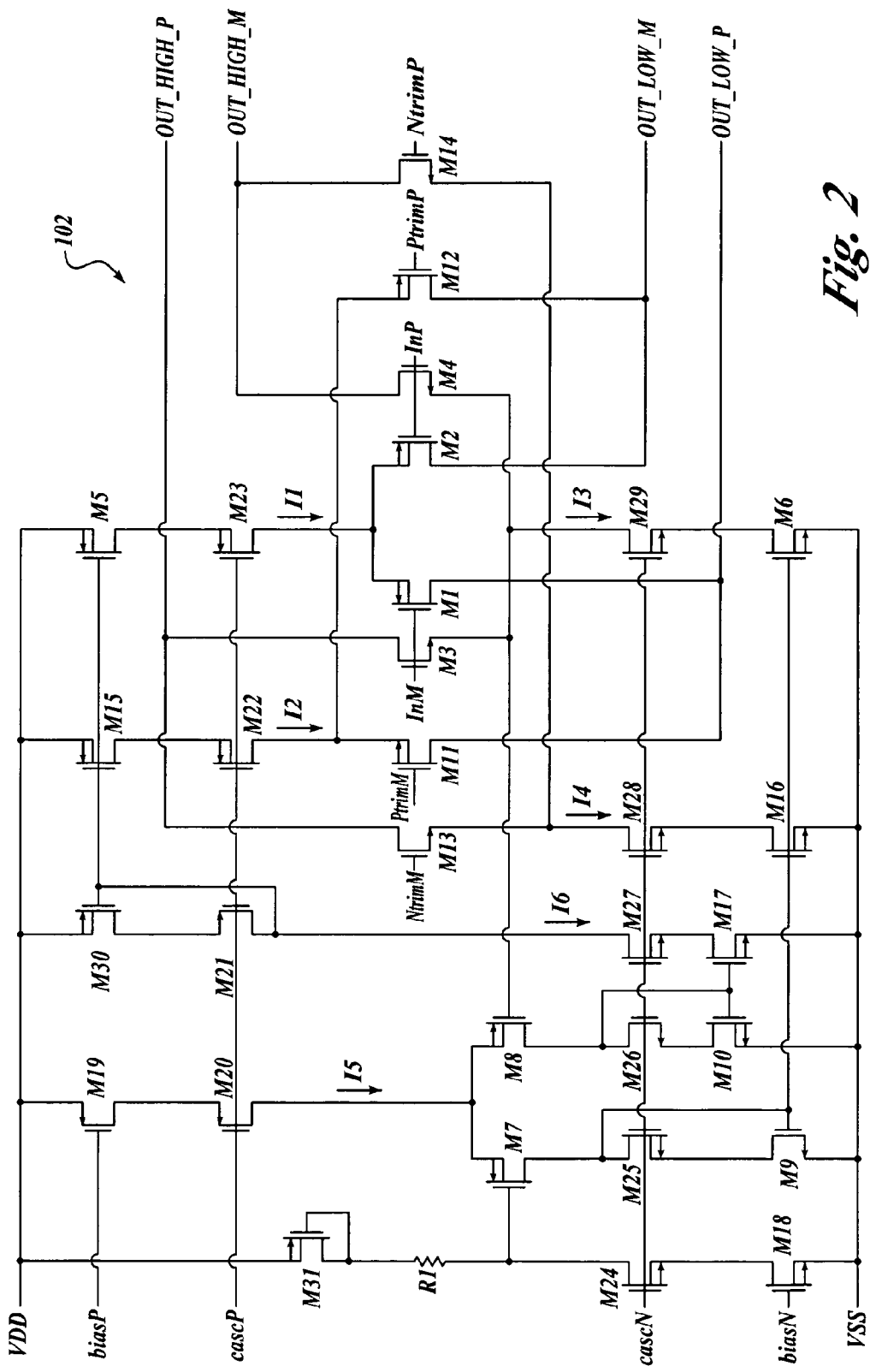
FIG. 2 shows a schematic diagram of an input circuit that is arranged in accordance with aspects of the present invention.

FIG. 2 is an illustration of a schematic diagram of an input circuit (102). Transistors M1 and M2 are PMOS devices that are arranged to operate as a differential pair that receives tail current I1. Transistors M1 and M2 are driven by the differential input signal (inP−inM). Transistors M11 and M12 are scaled versions (e.g., scaled by a factor $\alpha$) of transistors M1 and M2 that receive tail current I2. Transistors M11 and M12 are configured to receive the differential PMOS trim signal (PtrimP−PtrimM) on the gates of transistors M11 and M12. Transistors M1 and M2 are arranged to operate as a PMOS input stage. Transistors M11 and M12 are configured to operate as a PMOS trim stage.

Transistors M3 and M4 are NMOS devices that are configured to operate as a differential pair that receives tail current I3. Transistors M13 and M14 are scaled versions (e.g., scaled by a factor $\alpha$) of transistors M3 and M4 that receive tail current I4. Transistors M1 3 and M1 4 are configured to receive the differential NMOS trim signal (NtrimP−NtrimM) on the gates of transistors M13 and M14. Transistors M3 and M4 are arranged to operate as an NMOS input stage. Transistors M13 and M14 are configured to operate as an NMOS trim stage.

The input common mode voltage is detected on the sources of transistors M1 and M2. The input common mode voltage is also detected on the gate of transistor M8. Transistor M19 is configured to operate as a bias current source that provides a bias current (I5) to the source of transistors M7 and M8. Transistors M7 and M8 are arranged to operate as a current switch that compares the input common mode voltage (detected at the sources of transistors M3 and M4) to a reference voltage at the gate of transistor M7.

At high input common mode voltages, transistor M8 is off and transistor M7 conducts. Transistors M9, M16, and M6 are configured to operate as a current mirror. Bias current I5 is mirrored through transistor M9 to transistor M6 to provide tail current I3, and to transistor M16 to provide tail current I4. Transistors M16 and M6 are ratioed such that tail current I4 is a scaled-down version of tail current I3 (e.g., scaled by factor α). At high input common mode voltages, approximately no current is flowing into transistor M1, and therefore tails current I1 and I2 are approximately zero.

At low input common mode voltages, transistor M7 is off and transistor M8 conducts. Approximately all of the bias current (I5) flows through transistor M10. Transistors M10 and M17 are arranged to operate as a current mirror. Current I5 is reflected to provide current I6. Transistors M30, M15, and M5 are arranged to provide another current mirror. Current I6 is reflected to provide tail currents I1 and I2. Transistors M15 and M5 are ratioed such that tail current I2 is a scaled down version of tail current I1 (e.g., scaled by factor a). At low input common mode voltages, there is approximately no current is flowing into transistor M9, and therefore tails current I3 and I4 are approximately zero. At input common mode voltages close to the reference voltage (Vref), bias current I5 is gradually moved from one of the two input stages to the other. The transition is more gradual when the transconductance of transistors M7 and M8 are low. The transconductance of transistors M7 and M8 can be made low, for example, by using long, narrow devices for transistors M7 and M8.

Transistors M20–M29 are each configured to operate as a cascode transistor.

Transistors M1–M4 are all biased to operate in subthreshold (i.e. $V_{GS}<V_{th}$). In subthreshold, the drain current of a MOSFET is given by: $I_d=I_{d0} \exp((V_{GS}-V_{th})/(n*V_t))$, where n is the subthreshold slope factor. $I_{d0}$ is proportional to W/L. A threshold voltage mismatch ΔVth between the NMOS input stage and the PMOS input stage causes an input voltage offset of equal magnitude. Accordingly, the input referred offset (Vos) of a MOS input stage is given by $Vos=\Delta V_{th}+nV_t*(\Delta I_{d0}/I_{d0})$. This equation includes only the contribution of the input MOSFETs themselves. This equation includes one temperature-dependent term and one temperature-independent term. The NMOS and PMOS input stages can be designed such that the term ΔVth dominates. Since ΔVth is temperature-independent, the offset trim can be made relatively accurate over the operating range of the circuit using a temperature-independent trim when the transistors of the NMOS and PMOS input stages are biased in subthreshold.

At input common mode voltages close to Vref, if the current mirrors have a one-to-one ratio, a fraction β of the bias current (I5) flows through the NMOS input stage and another fraction (1−β) of the bias current flows through the PMOS input stage. According to one example, the current mirror formed by transistors M6 and M9 and the current mirror formed by transistors M5 and M30 each have a scaling ratio of k. In this example, $I1=k*\beta*I5$ and $I3=k*(1-\beta)*I5$. The differential output current ($I_{out}$) is given by $I_{out}=V_{in}*(g_{m,n}+g_{m,p})$, where Vin is the differential input voltage (inP−inM), $g_{m,n}$ is the transconductance of the NMOS input stage, and $g_{m,p}$ is the transconductance of the PMOS input stage. Substituting the subthreshold value of gm into this equation gives $I_{out}=(V_{in}*k*\beta*I5)/(nV_t)+$ $(V_{in}*k*(1-\beta)*I5)/(nV_t)=(V_{in}*k*I5)/(nV_t)$, where it is assumed that the subthreshold slope (n) for the NMOS and PMOS devices is the same. This equation shows that the transconductance of the input stage is the same across the entire input common mode voltage range. If the subthreshold slopes are not the same for the p-channel and n-channel devices, there may be a slight variation in the transconductance across the input common mode voltage range.

The differential output current due to offset ($I_{os}$) is given by: $I_{os}=(V_{os,n}*k*\beta*I5)/(nV_t)+(V_{os,p}*k*(1-\beta)*I5)/(nV_t)$, wherein $V_{os,n}$ and $V_{os,p}$ are the threshold voltage mismatch of the NMOS input stage and the PMOS input stage respectively. The differential output current due to the differential trim stage (Itrim) is given by: $Itrim=(V_{trim,n}*k*\beta*I5)/(\alpha nV_t)+(V_{trim,p}*k*(1-\beta)*I5)/(\alpha nV_t)$, where $\alpha=g_{m,in}/g_{m,trim}$, and $g_{m,trim}$ is the transconductance of the differential trim stage. The ratio between $g_{m,in}$ and $g_{m,trim}$ is equal to a because of the transistor and tail current scaling. Accordingly, the offset is cancelled for all input common mode voltages when $V_{trim,n}=\alpha V_{os,n}$ and $V_{trim,p}=\alpha V_{os,p}$.

The above specification, examples and data provide a description of the manufacture and use of the composition of the invention. Since many embodiments of the invention can be made without departing from the spirit and scope of the invention, the invention also resides in the claims hereinafter appended and legal equivalents. Any element in a claim that does not explicitly use the phrase "means for" or "step for" is not to be interpreted as a "means" or "step" clause as specified in 35 U.S.C. § 112, paragraph 6.

What is claimed is:

1. An input circuit that is arranged for rail-to-rail operation with a differential input signal, comprising:
    a differential input circuit for receiving the differential input signal, wherein the differential input circuit is configured to provide:
        a first positive differential current in response to the differential input signal, and
        a first negative differential current in response to the differential input signal;
    a differential trim circuit for enabling trimming of an offset, wherein the differential trim circuit is configured to provide:
        a second positive differential current in response to a differential positive trim signal; and
        a second negative differential current in response to a differential negative trim signal; and
    a current mirror stage for enabling a transconductance of the input circuit to be relatively constant for a common mode voltage of the differential input signal, comprising:
        a first current mirror circuit that is configured to receive a first current that is related to the common mode voltage, wherein the first current mirror circuit is further configured to reflect the first current to provide a first positive tail current to the differential input circuit, and further configured to reflect the first current to provide a second positive tail current to the differential trim circuit; and
        a second current mirror circuit that is configured to receive a second current that is related to the common mode voltage, wherein the second current mirror circuit is further configured to reflect the second current to provide a first negative tail current to the differential input circuit, and further configured to reflect the first current to provide a second negative tail current to the differential trim circuit; and
    an output stage for providing differential output currents.

2. The input circuit of claim 1, further comprising:
a comparison differential pair that is configured to receive a reference signal at a first gate of the comparison differential pair and further configured to receive a compared signal at a second gate of the comparison differential pair, wherein the compared signal is related to the common mode voltage of the differential input signal, and wherein the comparison differential pair is configured to provide the second current and a third current.

3. The input circuit of claim 2, further comprising:
a third current mirror circuit that is configured to reflect the third current to provide the first current.

4. The input circuit of claim 1, wherein the differential trim circuit is a replica of the differential input circuit, scaled by a factor.

5. A CMOS input circuit that is arranged for rail-to-rail operation with a differential input signal, comprising:
a differential input circuit for receiving the differential input signal, comprising:
  a PMOS differential input stage that is arranged to provide a first PMOS differential current in response to the differential input signal; and
  an NMOS differential input stage that is arranged to provide a first NMOS differential current in response to the differential input signal;
a differential trim circuit for enabling trimming of an offset, comprising:
  a PMOS differential trim stage that is arranged to provide a second PMOS differential current in response to a differential PMOS trim signal; and
  an NMOS differential trim stage that is arranged to provide a second NMOS differential current in response to a differential NMOS trim signal; and
a current mirror stage for enabling a transconductance of the input circuit to be relatively constant for a common mode voltage of the differential input signal, comprising:
  a first current mirror circuit that is configured to receive a first current that is related to the common mode voltage, wherein the first current mirror circuit is further configured to reflect the first current to provide a first PMOS tail current to the PMOS differential input stage, and further configured to reflect the first current to provide a second PMOS tail current to the PMOS differential trim stage; and
  a second current mirror circuit that is configured to receive a second current that is related to the common mode voltage, wherein the second current mirror circuit is further configured to reflect the second current to provide a first NMOS tail current to the NMOS differential input stage, and further configured to reflect the first current to provide a second NMOS tail current to the NMOS differential trim stage; and
an output stage for enabling the first PMOS differential current and the second PMOS differential current to be combined to provide a PMOS differential output current, and further enabling the first NMOS differential current and the second NMOS differential current to be combined to provide a NMOS differential output current.

6. The input circuit of claim 5, further comprising:
a comparison differential pair that is configured to receive a reference signal at a first gate of the comparison differential pair and further configured to receive a compared signal at a second gate of the comparison differential pair, wherein the compared signal is related to the common mode voltage of the differential input signal, and wherein the comparison differential pair is configured to provide the second current and a third current.

7. The input circuit of claim 6, further comprising:
a third current mirror circuit that is configured to reflect the third current to provide the first current.

8. The input circuit of claim 5 further comprising a summer circuit, wherein the summer circuit is further configured to provide a differential output current in response to the output PMOS differential current and the output NMOS differential current such that the differential output current is approximately equal to the sum of the output PMOS differential current and the output NMOS differential current.

9. The input stage of claim 8, wherein the summer circuit comprises a folded cascode amplifier circuit.

10. The input circuit of claim 5, wherein the PMOS differential input stage comprises a PMOS differential pair.

11. The input circuit of claim 10, wherein:
the NMOS differential input stage comprises an NMOS differential pair.

12. The input circuit of claim 5, wherein:
the output stage comprises a first node, a second node, a third node, and a fourth node;
the PMOS differential input stage is configured provide the first PMOS differential current at the first and second nodes;
the first NMOS differential input stage is configured to provide the first NMOS differential current at the third node and fourth nodes;
the PMOS differential trim stage is arranged to provide the second PMOS differential current at the first and second nodes; and
the NMOS differential trim stage is arranged to provide the second NMOS differential current at the third and fourth nodes.

13. The input circuit of claim 5, wherein the differential trim circuit is a replica of the differential input circuit, scaled by a factor.

14. The input circuit of claim 13, wherein the first current mirror circuit is configured to provide the first PMOS tail current and the second PMOS tail current such that the ratio of the second PMOS tail current to the first PMOS tail current corresponds to the factor, and wherein the second current mirror circuit is configured to provide the first NMOS tail current and the second NMOS tail current such that the ratio of the second NMOS tail current to the first NMOS tail current corresponds to the factor.

15. The input circuit of claim 5, wherein the differential input circuit and the differential trim circuit each comprises transistors that are biased for subthreshold operation.

16. A method employing an input circuit to provide differential output current in response to a differential input signal, the method comprising:
receiving the differential input signal via a rail-to-rail CMOS input stage;
trimming an offset of the differential input signal such that accuracy over temperature is approximately maintained; and
enabling a transconductance of the input circuit to be relatively constant for a common mode voltage of the differential input signal.

17. The method of claim 16, further comprising:
providing a first PMOS differential current in response to the differential input signal; and providing a first NMOS differential current in response to the differential input signal;

wherein trimming is accomplished via a differential trim circuit that is a scaled replica of the CMOS input stage, and wherein trimming comprises:

providing a second PMOS differential current in response to a differential PMOS trim signal providing a second NMOS differential current in response to a differential NMOS trim signal;

summing the first PMOS differential current to the second PMOS differential current to provide a PMOS differential output current; and summing the first NMOS differential current to the second NMOS differential current to provide an NMOS differential output current.

18. The method of claim 17, further comprising:

summing the PMOS differential output current and the NMOS differential output current to provide the differential output current.

19. The method of claim 16, wherein enabling comprises:

comparing a compared signal that is related to a common mode voltage of the differential input signal to a reference signal;

providing a first current and a second current in response to the comparison;

reflecting the first current to provide a third current;

reflecting the third current to provide a first PMOS tail current;

reflecting the third current to provide a second PMOS tail current such that the ratio of the first PMOS tail current and the second PMOS tail current corresponds to a factor;

reflecting the second current to provide a first NMOS tail current;

reflecting the second current to provide a second NMOS tail current such that the ratio of the first NMOS tail current and the second NMOS tail current corresponds to the factor;

driving the CMOS input stage with the first NMOS tail current and the second NMOS tail current; and driving a differential trim circuit with the first PMOS tail current and the second NMOS tail current, wherein the second PMOS and NMOS differential currents are provided via the differential trim circuit, and wherein the differential trim circuit is a replica of the CMOS input stage that is scaled by the factor.

20. The method of claim 16, further comprising:

biasing the rail-to-rail CMOS input stage in subthreshold.

21. An input circuit for rail-to-rail operation with a differential input signal, comprising:

a means for trimming an offset of the differential input signal such that accuracy over temperature is approximately maintained; and a means for enabling a transconductance of the input circuit to be relatively constant for a common mode voltage of the differential input signal.

22. The input circuit of claim 21, further comprising:

means for biasing the input circuit in subthreshold.

* * * * *

UNITED STATES PATENT AND TRADEMARK OFFICE
CERTIFICATE OF CORRECTION

| | | |
|---|---|---|
| PATENT NO. | : 7,170,347 B1 | Page 1 of 2 |
| APPLICATION NO. | : 10/716019 | |
| DATED | : January 30, 2007 | |
| INVENTOR(S) | : Willem Johannes Kindt | |

It is certified that error appears in the above-identified patent and that said Letters Patent is hereby corrected as shown below:

Title Page Col. 1 (U.S. Patent Documents); Line 1; After "4,618,833" delete "A" and insert -- B1 --, therefor.

Title Page Col. 2 (Primary Examiner); Line 1; Delete "Khank" and insert -- Khanh --, therefor.

Column 2; Line 18; After "FIG. 1" delete "is".

Column 2; Line 56; Delete "M1 3 and M1 4" and insert -- M13 and M14 --, therefor.

Column 3; Line 13; After "transistor" delete "M1 ," and insert -- M10, --, therefor.

Column 3; Line 14; After "current" delete "11 and 12" and insert --I1 and I2 --, therefor.

Column 5; Line 7; In Claim 2, after "to the" insert -- input --.

Column 5; Line 36; In Claim 5, after "constant" delete "for a" and insert -- over a range of input --, therefor.

Column 5; Line 37; In Claim 5, delete "voltage of" and insert -- voltages for --, therefor.

Column 5; Line 40; In Claim 5, after "to the" insert -- input --.

Column 5; Line 48; In Claim 5, after "to the" insert -- input --.

Column 6; Line 2; In Claim 6, after "to the" insert -- input --.

Column 6; Line 26; In Claim 12, after "configured" insert -- to --.

Column 6; Line 54; In Claim 16, after "provide" insert -- a --.

Column 7; Line 7; In Claim 17, after "signal" insert -- ; -- .

UNITED STATES PATENT AND TRADEMARK OFFICE
CERTIFICATE OF CORRECTION

PATENT NO.        : 7,170,347 B1
APPLICATION NO.   : 10/716019
DATED             : January 30, 2007
INVENTOR(S)       : Willem Johannes Kindt It is certified that error appears in the above-identified patent and that said Letters Patent is hereby corrected as shown below:

Column 7; Line 21; In Claim 19, after "related to" delete "a" and insert -- an input --, therefor.

Signed and Sealed this

Twenty-second Day of May, 2007

JON W. DUDAS
*Director of the United States Patent and Trademark Office*